United States Patent
Zhao et al.

(10) Patent No.: US 7,515,742 B2
(45) Date of Patent: Apr. 7, 2009

(54) AUTOMATIC SEGMENTATION OF STATIONARY TISSUE IN PCMR IMAGING

(75) Inventors: Meide Zhao, Lisle, IL (US); Tao Cai, Chicago, IL (US); Xiang He, Chicago, IL (US)

(73) Assignee: Vassol. Inc., Chicago, IL (US)

( * ) Notice: Subject to any disclaimer, the term of this patent is extended or adjusted under 35 U.S.C. 154(b) by 0 days.

(21) Appl. No.: 11/771,062

(22) Filed: Jun. 29, 2007

(65) Prior Publication Data

US 2008/0107316 A1  May 8, 2008

Related U.S. Application Data

(60) Provisional application No. 60/817,592, filed on Jun. 29, 2006.

(51) Int. Cl.
*G06K 9/00* (2006.01)
*G01V 3/00* (2006.01)

(52) U.S. Cl. ...................... 382/128; 324/307
(58) Field of Classification Search ............... 382/128; 324/307
See application file for complete search history.

(56) References Cited

U.S. PATENT DOCUMENTS

| | | | | |
|---|---|---|---|---|
| 5,257,626 A | * | 11/1993 | Pelc et al. | 600/410 |
| 5,309,100 A | * | 5/1994 | Song et al. | 324/306 |
| 5,773,975 A | * | 6/1998 | De Becker et al. | 324/306 |
| 5,828,215 A | * | 10/1998 | Boettcher | 324/306 |
| 6,150,814 A | * | 11/2000 | Redpath et al. | 324/307 |
| 6,408,201 B1 | * | 6/2002 | Foo et al. | 600/410 |
| 6,806,709 B2 | * | 10/2004 | Markl et al. | 324/309 |
| 7,292,032 B1 | * | 11/2007 | Polzin | 324/306 |
| 2002/0047708 A1 | * | 4/2002 | Miyoshi et al. | 324/307 |
| 2006/0066307 A1 | * | 3/2006 | Hinks et al. | 324/309 |
| 2006/0235669 A1 | * | 10/2006 | Charbel et al. | 703/11 |

FOREIGN PATENT DOCUMENTS

WO  WO-2008/005409 A2  1/2008
WO  WO-2008/005409 A3  1/2008

OTHER PUBLICATIONS

"Vascular Segmentation of Phase Contrast Magnetic Resonance Angiograms Based on Statistical Mixture Modeling and Local Phase Coherence", Chung A. C. S. et al., IEEE Transactions on Medical Imaging, vol. 23, No. 12, Dec. 2004, pp. 1490-1507.*

"Segmentation of Functional MRI by K-Means Clustering", Singh M. et al., IEEE Transactions on Nuclear Science, vol. 43, No. 3, Jun. 1996, pp. 2030-2036.*

(Continued)

*Primary Examiner*—Wenpeng Chen
(74) *Attorney, Agent, or Firm*—Schwegman, Lundberg & Woessner, P.A.

(57) ABSTRACT

A method and system are described for compensating for the phase error in PCMR images due to eddy current effects. The phase noise due to eddy currents may be measured and characterized from phase images at selected regions near a vessel of interest.

14 Claims, 2 Drawing Sheets

OTHER PUBLICATIONS

International Application Serial No. PCT/US07/15313, Written Opinion mailed Jun. 24, 2008, 6 pgs.

International Application Serial No. PCT/US07/15313, Search Report mailed Jun. 24, 2008, 7 pgs.

Chung, A. C.S, et al., "Vascular Segmentation Of Phase Contrast Magnetic Resonance Angiograms Based Statistical Mixture Modeling and Local Phase Coherence," *IEEE Transactions on Medical Imaging*, vol. 23, No. 12 (Dec. 2004), 1490-1507.

Singh, M., et al., "Segmentation Of Functional MRI by K-Means Clustering," *IEEE Transactions on Nuclear Science*, vol. 43, No. 3 (Jun. 1996), 2030-2036.

\* cited by examiner

AUTOMATIC SEGMENTATION OF STATIONARY TISSUE IN PCMR IMAGING

RELATED APPLICATIONS

This application is based upon, and claims priority to, previously filed provisional application Ser. No. 60/817,592, filed on Jun. 29, 2006. The provisional application is hereby incorporated by reference. This application is also related to U.S. patent application Ser. Nos. 09/400,365, which was issued on Mar. 13, 2007 as U.S. Pat. No. 7,191,110, Ser. No. 11/032,306, which was published on Jul. 13, 2006 as U.S. Publication No. US-2006-0155187-A1, and Ser. No. 11/324,126, which was published on Oct. 19, 2006 as U.S. Publication No. US-2006-0235669-A1, the disclosures of which are incorporated by reference in their entirety.

BACKGROUND

In magnetic resonance imaging, the spins of specific nuclei (usually hydrogen nuclei) in a tissue are excited by radiofrequency (RF) pulses in the presence of an applied static magnetic field in a selected direction, the magnitude of which is made to spatially vary in a defined time sequence. The precessional frequencies of the excited spins vary in relation to the magnitude of the applied magnetic field and thereby produce a precessional signal from which the spatial locations of the spins can be derived. By applying one or more excitation RF pulses and a specific sequence of linear spatial variations in the applied magnetic field, referred to as gradient pulses, the resulting precessional signal can be interpreted as a carrier waveform amplitude modulated by the Fourier transform of the spatial distribution of spin density in a selected portion of the tissue. The carrier waveform in this case is a complex sinusoid at the spin resonance frequency with no gradient applied (i.e., the Larmor frequency of the spin species). Transformation from the spatial frequency domain, referred to as k-space, to the image position domain can be accomplished by inverse Fourier transforming the k-space signal which is generated after demodulation of the precessional signal. The k-space signal is thereby transformed to a spin density function in position space which can be used to generate an image where the intensity of an image pixel varies in accordance with the magnitude of the spin density function at the pixel location. In order to image a selected volume of interest (VOI) in the body, an MRI data set is acquired which is made up of a plurality of slices derived from a two-dimensional (2D) spin density function or a plurality of slabs derived from a three-dimensional (3D) spin density function. As the term is used herein, "image" should be taken to mean either an actual visual representation or the data from which such a representation could be rendered. Similarly, a "pixel" or "voxel" should be taken to mean either a discrete element of an actual 2D or 3D visual representation, respectively, or the corresponding element of a 2D or 3D object from which such a representation could be rendered.

The time sequence of RF excitation and gradient pulses may be manipulated so that the spin density function derived from the k-space signal is dependent upon other parameters in addition to spin density, such as the spin-lattice relaxation time constant $T_1$ or the spin-spin relaxation time constant $T_2$. The time constant $T_1$ relates to the time required for spins to recover longitudinal magnetization after an excitation pulse, the longitudinal magnetization being necessary for the generation of an FID (free induction decay) signal following an excitation pulse. A pulse sequence may be designed so that spins with a shorter $T_1$ are weighted more heavily in the spin density function, and a so-called $T_1$ weighted image may be derived from such a spin density function. The time-of-flight (TOF) method of imaging blood flow in tissue involves the use of repeated excitation pulses timed so that blood flowing from an unexcited region into the region excited by the pulses has a greater longitudinal magnetization than the stationary tissue in the excited region. The moving blood thus mimics a tissue with a short $T_1$ and produces an enhanced spin signal. TOF imaging may be used to selectively image blood vessels owing to the moving blood contained within the vessels.

Blood flow may be imaged and quantified by another technique, phase contrast magnetic resonance (PCMR). The k-space signal from the excited spins is a complex signal in which the real and imaginary components modulate the carrier waveform in phase quadrature. Ideally, inverse Fourier transformation of the k-space signal results in a purely real spin density function. Certain artifacts may cause the spin density function to have both real and imaginary parts, but this problem can be circumvented in normal imaging by varying the image pixel or voxel intensity in accordance with the magnitude of the spin density function to create a so-called magnitude image. In PCMR, on the other hand, a bipolar gradient pulse is used to cause flowing spins to acquire a phase which is proportional to the velocity of the spins in the direction of the gradient. After such phase-encoding of velocity, the phase can be extracted from the spin density function to measure the magnitude of blood flow. The extracted phase can also be used to construct an image where the pixel or voxel intensity varies with the phase of the spin density function at the location of the pixel or voxel, called a phase image. A phase image derived from a k-space signal derived after application of an appropriate through-plane bipolar gradient pulse, for example, can provide a visual representation of the magnitude of blood flow through the plane of the image.

DETAILED DESCRIPTION

Figure 1:
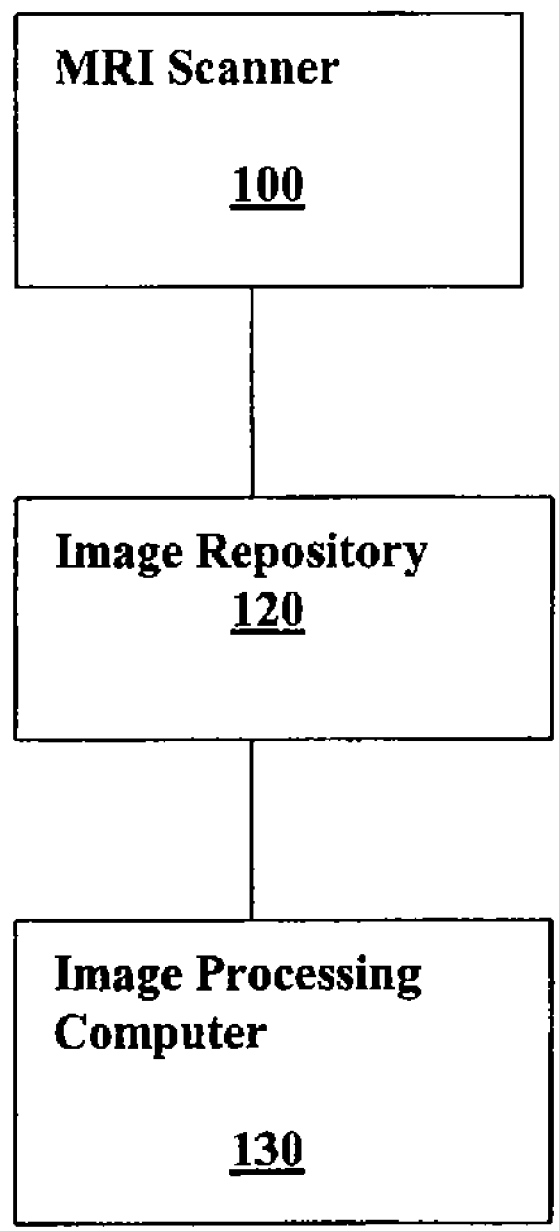
FIG. 1 depicts an exemplary system for implementing the described phase shift compensation method.
Figure 2:
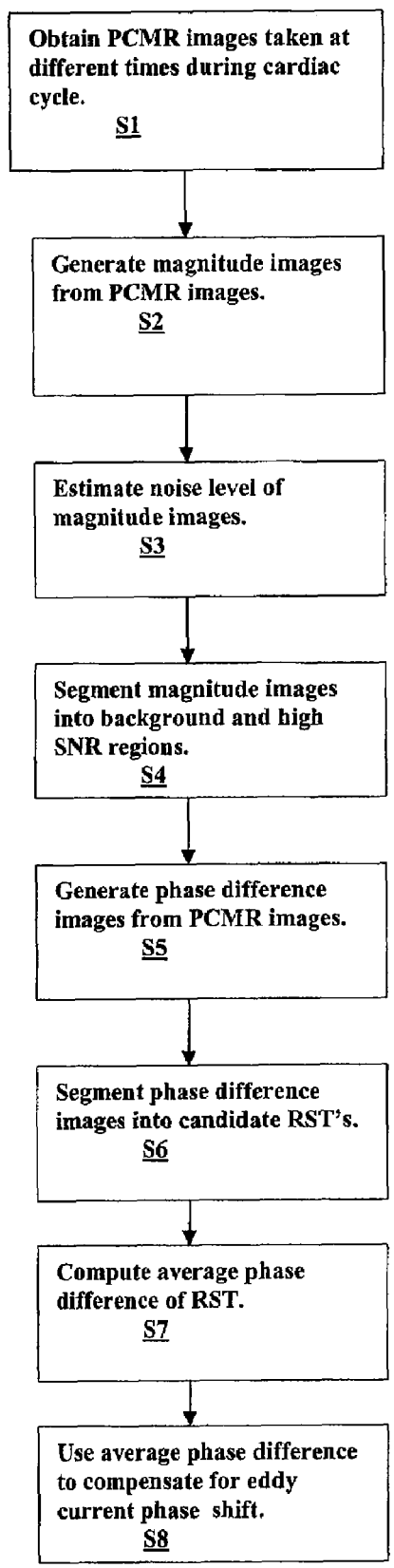
FIG. 2 illustrates an exemplary algorithm for phase shift compensation.

In blood flow analyses using phase contrast magnetic resonance imaging (PCMR), such as described above, flow sensitive areas (blood vessel) and flow insensitive areas (background, stationary tissue) are differentiated by phase shift. Stationary tissue is subtracted from two acquisitions with bipolar velocity gradients of opposite polarities. However, the rapid switching of magnetic gradient and RF pulses during image acquisition may induce eddy currents that introduce artifacts in the phase image. Under such circumstance, the stationary tissue will have non-zero mean for the phase shift. An approach to compensate for these phase shift artifacts is to apply background subtraction in flow estimation.

Automatic segmentation of stationary tissue implies the estimation of noise distribution of PCMR magnitude and phase image. As described in the literature, MRI magnitude image data are Rician distributed. Commonly, the noise variation is estimated from a single magnitude image in large homogenous signal region or non-signal region. The selection of region for noise variance estimation can be done manually or automatically. However, large uniform regions are often hard to find, thus a method utilizing multiple images acquired under identical imaging conditions is more suitable.

The noise in a phase image is more complicated. In regions where there is only noise (in magnitude image), the noise is a uniform PDF within $[-2\pi, 2\pi]$. For regions with high signal to noise ratio, the phase noise can be approximated by Gaussian distribution with standard deviation as the reciprocal of SNR.

Described herein is a method to segment a region of stationary tissue (RST) from PCMR images. Based on the noise estimates from magnitude image, background (air & CSF) and high SNR regions are separated. Then, in high SNR regions, the noise variance of a phase image is estimated. Vessels are subsequently detected from phase image. At the last step, an optimal RST region is selected.

Automatic segmentation of stationary tissue implies the estimation of noise distribution of PCMR magnitude and phase image. For PCMR magnitude images, images are obtained from different intervals of a cardiac cycle. Due to differences in blood flow, images contain areas with time-varying magnitude and phase information.

To estimate the noise of a magnitude image, the images are normalized so that the square sums are the same. An averaged image is calculated and is compared with all single images. The spatial average of the average sum of square error equals two times of the magnitude image noise variance. The magnitude image is subsequently divided into three regions: background area (air and CSF) with intensity close to image noise; medium SNR area with SNR below a threshold value; and area with high SNR above the threshold value. The noise in a phase image depends on the SNR of the magnitude image. By removing background area, the noise of the RST area of phase image is approximated as a Gaussian distribution. Using the similar method as for the magnitude image, the standard deviation of the noise distribution for phase image can be estimated. Since ideally, tissue area without blood flow should have zero phase difference, the average phase difference in studied images is estimated as the average value of the low phase difference area. The vessel area can be subsequently segmented.

To reliably classify the blood vessel, an intermediate image may be created. The approach is based the following observation: since images are at different interval within a cardiac cycle, vessel pixels will show time varying intensities. First, the mean and the standard deviation at each image pixels (except areas marked as background) are estimated. The standard deviation is then compared with the noise level of the image (adjusted with SNR). If two values are similar, then the mean value is chosen as the value of intermediate image at that point. If both mean and the standard deviation are significantly deviate with the image noise level, it is very likely inside a vessel. Thus, depending on the difference between the mean value at that pixel and the average phase difference of the image, the maximum or minimum value of phase difference are selected.

The RST should preferably satisfy several criteria. First, the RST should not contain any vessel or background area. Second, it should be close to selected vessel area, thus the phase shift induced from gradient inhomogeneity is the same as of the prescribed vessel. Third, the region should be smooth both in magnitude and phase images. Hence, the noise distributions within RST are similar to the entire images. In one implementation, all possible RST regions are permuted and an optimal region is selected.

To summarize, in vessel flow quantification using phase contrast magnetic resonance (PCMR) imaging, stationary tissue around the neighborhood should have a phase difference with a zero mean distribution. However, it is possible for the stationary tissue to have non-zero mean phase contrast due to causes such as un-compensated Eddy current. Automatic segmentation of stationary tissue from PCMR magnitude and phase images, and accurate estimation of the distribution of the phase contrast images, can improve the accuracy of blood flow quantization. The method described herein uses a PCMR series from blood flow studies to segment the PCMR image as background (air or cavity), vessel and stationary tissue area. Then, a region of stationary tissue can be selected at the neighborhood of the detected vessel. The methods described herein may be combined with any of the methods or systems described in U.S. patent application Ser. Nos. 09/400,365, 11/032,306 and 11/324,126.

Exemplary Embodiment

FIG. 1 illustrates an exemplary system that may used to implement the methods described herein. One system component is an MRI scanner 100 that includes a main magnet, gradient coils, RF coils, RF electronics, gradient amplifiers, pulse sequence computer, and an image reconstruction computer. The MRI scanner generates images and communicates the images to an image repository 120. An image processing computer 130 retrieves selected images from the image repository and is programmed to process the images using the methods described herein. The image processing computer may include an input device (e.g., keyboard) and a device for displaying the processed images to a user (e.g., a monitor).

FIG. 4 illustrates an exemplary algorithm that could be executed by the image processing computer and/or MRI scanner. The algorithm may be implemented as a fully automatic process or certain steps may be performed manually with user input. At step S1, PCMR images taken at different times during a single cardiac cycle are obtained, where the PCMR images contain one or more blood vessels of interest and are generated as a series of pairs of PCMR images with each member of a pair being generated using a bipolar velocity gradient of opposite polarity to the other member of the pair. At step S2, magnitude images are generated from the PCMR images. At step S3, the magnitude noise level of the magnitude images is estimated by computing the standard deviation of the pixel intensity in one or more of the magnitude images. At step S4 the magnitude images are segmented in accordance with pixel magnitude intensity into background regions having pixel magnitude intensities approximately equal to the magnitude noise level and into high SNR regions having pixel magnitude intensities above a specified threshold. At step S5, phase difference images are generated from the series of pairs of PCMR images. At step S6, the phase difference images are segmented into one or more candidate RST's (region of stationary tissue), wherein a candidate RST is selected such that the pixel locations of the candidate RST correspond to the pixel locations of a high SNR region of the magnitude images and such that no pixel locations of the candidate RST are within blood vessels. At step S7, an average phase difference of the candidate RST is computed by spatially averaging the phase difference intensities of the pixels making up the candidate RST. At step S8, the average phase difference is employed to correct a non-zero mean phase shift in the phase difference images due to eddy current effects.

The above-described algorithm may further include estimating the phase noise of the phase difference images by computing a standard deviation for the phase difference intensities across all pixels of the candidate RST, computing a mean and a standard deviation for each pixel of the candidate RST with respect to time in the series of phase difference images, comparing the mean and standard deviation of each pixel of the candidate RST with respect to time with the average phase difference and estimated phase noise, respectively, of the candidate RST, and classifying a pixel of the candidate RST as being contained within a blood vessel if the mean and standard deviation of that pixel with respect to time differ significantly with the average phase difference and estimated phase noise, respectively, of the candidate RST. The algorithm may further include selecting another candidate RST if some specified number of pixels of a present candidate RST are classified as being contained within a blood vessel. The algorithm may further include modifying a candidate RST by removing pixels classified as being contained within a blood vessel. The algorithm may further include selecting another candidate RST if the magnitude and phase pixel intensities of a present candidate RST are found to not satisfy a specified smoothness criterion. The algorithm may further include equating the average phase difference of the candidate RST with the non-zero mean phase shift in the phase difference images due to eddy current effects and correcting the phase difference images by subtracting the average phase difference of the candidate RST from the phase difference intensity of each pixel of a phase difference image. The algorithm may further include estimating the phase noise of the phase difference images by computing a standard deviation for the phase difference intensities across all pixels of the candidate RST, interpreting the average phase difference and standard deviation of the phase difference intensities of the candidate RST as the mean and standard deviation of the probability density function (PDF) of the phase noise due to eddy currents, and employing the PDF of the phase noise due to eddy currents to filter such phase noise from the phase difference images.

The invention has been described in conjunction with the foregoing specific embodiments. It should be appreciated that those embodiments may also be combined in any manner considered to be advantageous. Also, many alternatives, variations, and modifications will be apparent to those of ordinary skill in the art. Other such alternatives, variations, and modifications are intended to fall within the scope of the following appended claims.

What is claimed is:

1. A method, comprising:
   obtaining PCMR (phase contrast magnetic resonance) images at different times during a single cardiac cycle, wherein the PCMR images contain one or more blood vessels of interest and are generated as a series of pairs of PCMR images with each member of a pair being generated using a bipolar velocity gradient of opposite polarity to the other member of the pair;
   generating magnitude images from the PCMR images;
   estimating a magnitude noise level of the magnitude images by computing the standard deviation of a pixel intensity in one or more of the magnitude images;
   segmenting the magnitude images in accordance with pixel magnitude intensity into background regions and into high SNR (signal-to-noise ratio) regions having pixel magnitude intensities above a specified threshold;
   generating phase difference images from the series of pairs of PCMR images;
   segmenting the phase difference images into one or more candidate RST's (region of stationary tissue), wherein a candidate RST is selected such that the pixel locations of the candidate RST correspond to the pixel locations of a high SNR region of the magnitude images and such that no pixel locations of the candidate RST are within blood vessels;
   computing an average phase difference of the candidate RST by spatially averaging phase difference intensities of the pixels making up the candidate RST; and,
   employing the average phase difference to correct a non-zero mean phase shift in the phase difference images due to eddy current effects.

2. The method of claim 1 further comprising:
   estimating a phase noise of the phase difference images by computing a standard deviation for the phase difference intensities across all pixels of the candidate RST;
   computing a mean and a standard deviation for each pixel of the candidate RST with respect to time in a series of phase difference images;
   comparing the mean and standard deviation of each pixel of the candidate RST with respect to time with the average phase difference and estimated phase noise, respectively, of the candidate RST;
   classifying a pixel of the candidate RST as being contained within a blood vessel if the mean and standard deviation of that pixel with respect to time differ significantly with the average phase difference and estimated phase noise, respectively, of the candidate RST.

3. The method of claim 2 further comprising selecting another candidate RST if some specified number of pixels of a present candidate RST are classified as being contained within a blood vessel.

4. The method of claim 2 further comprising modifying a candidate RST by removing pixels classified as being contained within a blood vessel.

5. The method of claim 2 further comprising selecting another candidate RST if magnitude and phase pixel intensities of a present candidate RST are found to not satisfy a specified smoothness criterion.

6. The method of claim 1 further comprising:
   equating the average phase difference of the candidate RST with the non-zero mean phase shift in the phase difference images due to eddy current effects; and,
   correcting the phase difference images by subtracting the average phase difference of the candidate RST from the phase difference intensity of each pixel of a phase difference image.

7. The method of claim 1 further comprising:
   estimating a phase noise of the phase difference images by computing a standard deviation for the phase difference intensities across all pixels of the candidate RST;
   interpreting the average phase difference and standard deviation of the phase difference intensities of the candidate RST as the mean and standard deviation of the probability density function (PDF) of the phase noise due to eddy currents; and,
   employing the PDF of the phase noise due to eddy currents to filter such phase noise from the phase difference images.

8. A system, comprising:
   an MRI (magnetic resonance imaging) scanner;
   an image processing computer configured to receive images generated by the MRI scanner, wherein the image processing computer is programmed to:
   obtain PCMR (phase contrast magnetic resonance) images at different times during a single cardiac cycle, wherein the PCMR images contain one or more blood vessels of interest and are generated as a series of pairs of PCMR images with each member of a pair being generated using a bipolar velocity gradient of opposite polarity to the other member of the pair;
   generate magnitude images from the PCMR images;

estimate a magnitude noise level of the magnitude images by computing the standard deviation of a pixel intensity in one or more of the magnitude images;

segment the magnitude images in accordance with pixel magnitude intensity into background regions and into high SNR (signal-to-noise ratio) regions having pixel magnitude intensities above a specified threshold;

generate phase difference images from the series of pairs of PCMR images;

segment the phase difference images into one or more candidate RST's (region of stationary tissue), wherein a candidate RST is selected such that the pixel locations of the candidate RST correspond to the pixel locations of a high SNR region of the magnitude images and such that no pixel locations of the candidate RST are within blood vessels;

compute an average phase difference of the candidate RST by spatially averaging phase difference intensities of the pixels making up the candidate RST; and, employ the average phase difference to correct a non-zero mean phase shift in the phase difference images due to eddy current effects.

9. The system of claim 8 wherein the image processing computer is further programmed to:

estimate a phase noise of the phase difference images by computing a standard deviation for the phase difference intensities across all pixels of the candidate RST;

compute a mean and a standard deviation for each pixel of the candidate RST with respect to time in a series of phase difference images;

compare the mean and standard deviation of each pixel of the candidate RST with respect to time with the average phase difference and estimated phase noise, respectively, of the candidate RST;

classify a pixel of the candidate RST as being contained within a blood vessel if the mean and standard deviation of that pixel with respect to time differ significantly with the average phase difference and estimated phase noise, respectively, of the candidate RST.

10. The system of claim 8 wherein the image processing computer is further programmed to select another candidate RST if some specified number of pixels of a present candidate RST are classified as being contained within a blood vessel.

11. The system of claim 8 wherein the image processing computer is further programmed to modify a candidate RST by removing pixels classified as being contained within a blood vessel.

12. The system of claim 8 wherein the image processing computer is further programmed to select another candidate RST if magnitude and phase pixel intensities of a present candidate RST are found to not satisfy a specified smoothness criterion.

13. The system of claim 8 wherein the image processing computer is further programmed to:

equate the average phase difference of the candidate RST with the non-zero mean phase shift in the phase difference images due to eddy current effects; and, correct the phase difference images by subtracting the average phase difference of the candidate RST from the phase difference intensity of each pixel of a phase difference image.

14. The system of claim 8 wherein the image processing computer is further programmed to:

estimate a phase noise of the phase difference images by computing a standard deviation for the phase difference intensities across all pixels of the candidate RST;

interpret the average phase difference and standard deviation of the phase difference intensities of the candidate RST as the mean and standard deviation of the probability density function (PDF) of the phase noise due to eddy currents; and, employ the PDF of the phase noise due to eddy currents to filter such phase noise from the phase difference images.

* * * * *